United States Patent
Kim (10) Patent No.: US 8,644,088 B2
(45) Date of Patent: Feb. 4, 2014

(54) SEMICONDUCTOR MEMORY DEVICE AND SEMICONDUCTOR SYSTEM INCLUDING THE SAME

(75) Inventor: Sung-Mook Kim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 153 days.

(21) Appl. No.: 13/283,094

(22) Filed: Oct. 27, 2011

(65) Prior Publication Data

US 2012/0106265 A1    May 3, 2012

(30) Foreign Application Priority Data

Oct. 28, 2010  (KR) .................. 10-2010-0106043
Sep. 22, 2011  (KR) .................. 10-2011-0095705

(51) Int. Cl.
*G11C 7/10* (2006.01)

(52) U.S. Cl.
USPC .............. 365/189.05; 365/154; 365/189.011; 365/189.03; 365/189.14; 365/189.15; 365/189.16; 365/194; 365/191

(58) Field of Classification Search
USPC ................ 365/154, 189.011, 189.03, 189.14, 365/189.15, 189.16, 189.05, 194, 191
See application file for complete search history.

(56) References Cited

U.S. PATENT DOCUMENTS

| | | | | |
|---|---|---|---|---|
| 4,888,741 A | * | 12/1989 | Malinowski | ............. 365/230.05 |
| 7,355,907 B2 | | 4/2008 | Chen et al. | |
| 2011/0158032 A1 | * | 6/2011 | Kang | ....................... 365/233.16 |

FOREIGN PATENT DOCUMENTS

| | | |
|---|---|---|
| JP | 2007-531957 | 11/2007 |
| KR | 100574108 | 4/2006 |

* cited by examiner

*Primary Examiner* — Fernando Hidalgo
(74) *Attorney, Agent, or Firm* — IP & T Group LLP (57) ABSTRACT

A semiconductor memory device includes a memory block configured to store a data inputted/outputted through a data transfer line, a data output block configured to output the data loaded on the data transfer line in response to a source clock, wherein the data output block is controlled to be coupled with the data transfer line in response to a write operation signal, a write operation signal generation block configured to generate the write operation signal in response to an operation selection signal and a reference clock lagging behind the source clock by a set time, and a data input block configured to load the data on the data transfer line in response to the write operation signal.

23 Claims, 6 Drawing Sheets

SEMICONDUCTOR MEMORY DEVICE AND SEMICONDUCTOR SYSTEM INCLUDING THE SAME

CROSS-REFERENCE TO RELATED APPLICATIONS

The present application claims priority of Korean Patent Application Nos. 10-2010-0106043, filed on Oct. 28, 2010, and 10-2011-0095705, filed on Sep. 22, 2011, which is incorporated herein by reference in its entirety.

BACKGROUND

1. Field

Exemplary embodiments of the present invention relate to a semiconductor designing technology, and more particularly, to a semiconductor memory device for storing a series of data and a semiconductor system including the semiconductor memory device.

2. Description of the Related Art

Advancements in semiconductor fabrication technology facilitate the design of a System-On-a-Chip (SOC) and accelerate miniaturization of products.

In SOC products, embedded memory is an important component of the products. In other words, important features of SOC products are in memories, and the capacities of the embedded memories are increasing.

Static Random Access Memory (SRAM) is a RAM device which retains the contents of data bits in the inside of a memory to which a power source is supplied. In particular, since embedded SRAM micro device includes high-capacity buses and may be frequently accessed, it is a major power consumption source in an SOC product.

However, when image signals are compressed into a file format such as Joint Photographic Expert Group (JPEG) through an Image Signal Processor (ISP) in a device converting an optical image into electrical signals such as a CMOS image sensor (CIS), the SRAM device which includes high-capacity buses is useful in repeatedly performing a set of read and write operations onto the image signals, that is, an SRAM device is useful to perform a read-and-write operation in a burst pattern.

Figure 1:
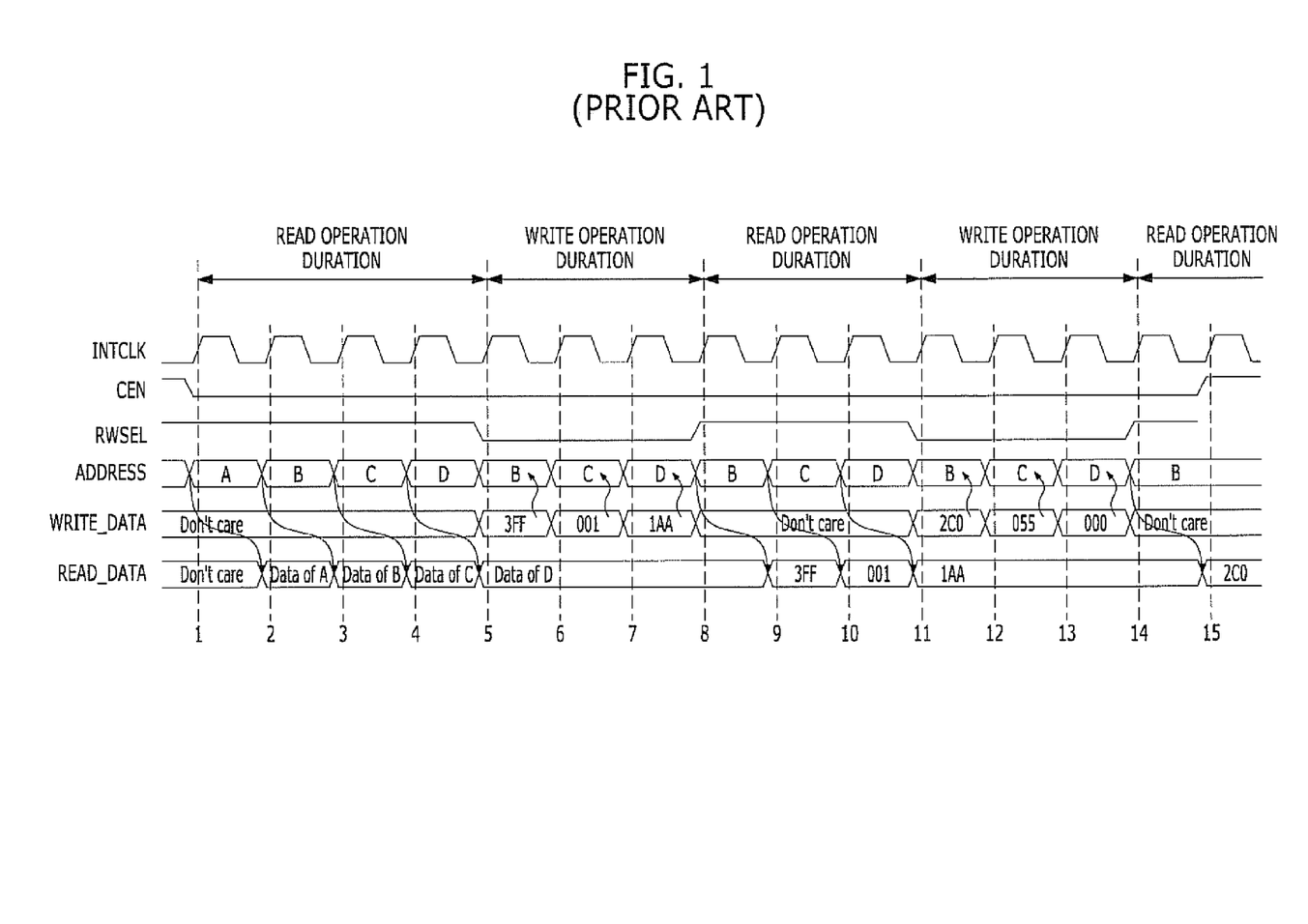
FIG. 1 is a timing diagram illustrating an operation of a conventional Static Random Access Memory (SRAM) device.

FIG. 1 is a timing diagram illustrating the operation of a conventional Static Random Access Memory (SRAM) device.

Referring to FIG. 1, when repeatedly performing the operations of read and write onto image signals, the conventional SRAM device operates in response to one command at a time.

More specifically, the conventional SRAM device is able to output data READ_DATA (Data of A, Data of B, Data of C, and Data of D) that are stored in a data storage space corresponding to an address signal ADDRESS (A, B, C and D) for an operation period where an image data is read for the first time, which is a period corresponding to the first to fourth pulses of a source clock INTCLK, but the conventional SRAM device is not able to store an external data WRITE_DATA inputted from the outside for the period. Since the value of the external data WRITE_DATA inputted from the outside is not stored, it is noted in the drawing with "Don't care", which means it does not matter whatever value is received from the outside.

The conventional SRAM device is able to store external data WRITE_DATA (3FF, 001, and 1AA) that are received from the outside in a data storage space corresponding to the address signal ADDRESS (B, C, and D) for an operation period where an image data is written for the first time, which is a period corresponding to the fifth to seventh pulses of the source clock INTCLK, but the conventional SRAM device is not able to output a data stored in the data storage space corresponding to the address signal ADDRESS (B, C, and D) for the period. Therefore, a data Data of D that is outputted before the operation period where the image data WRITE_DATA is written is outputted continuously while being latched.

Subsequently, the conventional SRAM device is able to output the data READ_DATA (3FF, 001, and 1AA) that are stored in the data storage space corresponding to the address signal ADDRESS (B, C, and D) for an operation period where the image data is read for the second time, which is a period corresponding to the eighth to tenth pulses of the source clock INTCLK, but the conventional SRAM device is not able to store an external data WRITE_DATA inputted from the outside for the period. Since the value of the data WRITE_DATA inputted from the outside is not stored, it is noted in the drawing with "Don't care", which means it does not matter whatever value is received from the outside. Also, the address signal ADDRESS used for the operation period where an image data READ_DATA is read for the second time (which is the period corresponding to the eighth to tenth pulses of the source clock INTCLK) and the address signal ADDRESS used for the operation period where the image data WRITE_DATA is stored for the first time (which is the period corresponding to the fifth to seventh pulses of the source clock INTCLK) are the same. As a result, the values 3FF, 001, and 1AA stored in the operation period where the image data WRITE_DATA is stored for the first time (which is the period corresponding to fifth to seventh pulses of the source clock INTCLK) are outputted as they are in the operation period where the image data READ_DATA is read for the second time (which is the period corresponding to the eighth to tenth pulses of the source clock INTCLK).

Likewise, the conventional SRAM device is able to store external data WRITE_DATA (2C0, 005, and 000) that are received from the outside in a data storage space corresponding to the address signal ADDRESS (B, C, and D) for an operation period where an image data WRITE_DATA is written for the second time, which is a period corresponding to the $11^{th}$ to $13^{th}$ pulses of the source clock INTCLK, but the conventional SRAM device is not able to output a data stored in the data storage space corresponding to an address signal ADDRESS (B, C, and D) for the period. Therefore, a data 1AA that is outputted before the operation period where the image data WRITE_DATA is written is outputted continuously while being latched.

As described above, a period where a read operation is performed and a period where a write operation is performed are to be clearly divided based on the toggling/pulsing of the source clock INTCLK in the conventional SRAM device. Therefore, all commands are to be inputted in synchronization with a reference edge of the source clock even when the operations of reading and writing an image data are carried out in a burst pattern. To this end, the frequency of the source clock is to be maintained at a sufficiently high level, which increases the amount of current consumption.

SUMMARY

An embodiment of the present invention is directed to a semiconductor memory device that processes a plurality of commands in response to one command in an operation of reading and writing image data of a burst pattern.

Another embodiment of the present invention is directed to a semiconductor memory device that performs a read operation and a write operation together during a write operation in an operation of reading and writing image data of a burst pattern.

In accordance with an embodiment of the present invention, a semiconductor memory device includes: a memory block configured to store a data inputted/outputted through a data transfer line; a data output block configured to output the data loaded on the data transfer line in response to a source clock, wherein the data output block is controlled to be coupled with the data transfer line in response to a write operation signal, a write operation signal generation block configured to generate the write operation signal in response to an operation selection signal and a reference clock lagging behind the source clock by a set time; and a data input block configured to load the data on the data transfer line in response to the write operation signal.

In accordance with another embodiment of the present invention, a semiconductor memory device includes: a plurality of memory blocks configured to store data inputted/outputted through a plurality of data transfer lines, respectively; a plurality of data output blocks configured to output the data loaded on the data transfer lines in response to a source clock, wherein the data output blocks are controlled to be coupled with the data transfer lines in response to a plurality of write operation signals; a write operation signal generation block configured to generate the write operation signals in response to a plurality of operation selection signals that respectively correspond to the memory blocks and a reference clock lagging behind the source clock by a set time; and a plurality of data input blocks configured to load the data on the data transfer lines in response to the write operation signals, respectively.

In accordance with yet another embodiment of the present invention, a method for operating a semiconductor memory device inputting/outputting a data through a data transfer line includes: latching a data loaded on the data transfer line in response to a source clock and outputting a latched data to outside; and loading an external data on the data transfer line in response to a reference clock lagging behind the source clock by a set time, when an operation selection signal is activated.

In accordance with still another embodiment of the present invention, a semiconductor system includes: a controller configured to control an operation selection signal to be activated or inactivated; and a semiconductor memory device configured to perform a data read and write operation or a data read operation within one cycle of a source clock based on whether the operation selection signal is activated or inactivated, wherein the semiconductor memory device, when the operation selection signal is activated, latches a data stored therein and outputs a latched data for a set time whenever the source clock pulses, and receives and stores a data transferred from the controller therein after the output of the latched data, and the semiconductor memory device, when the operation selection signal is inactivated, outputs the data stored therein to the controller whenever the source clock pulses.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
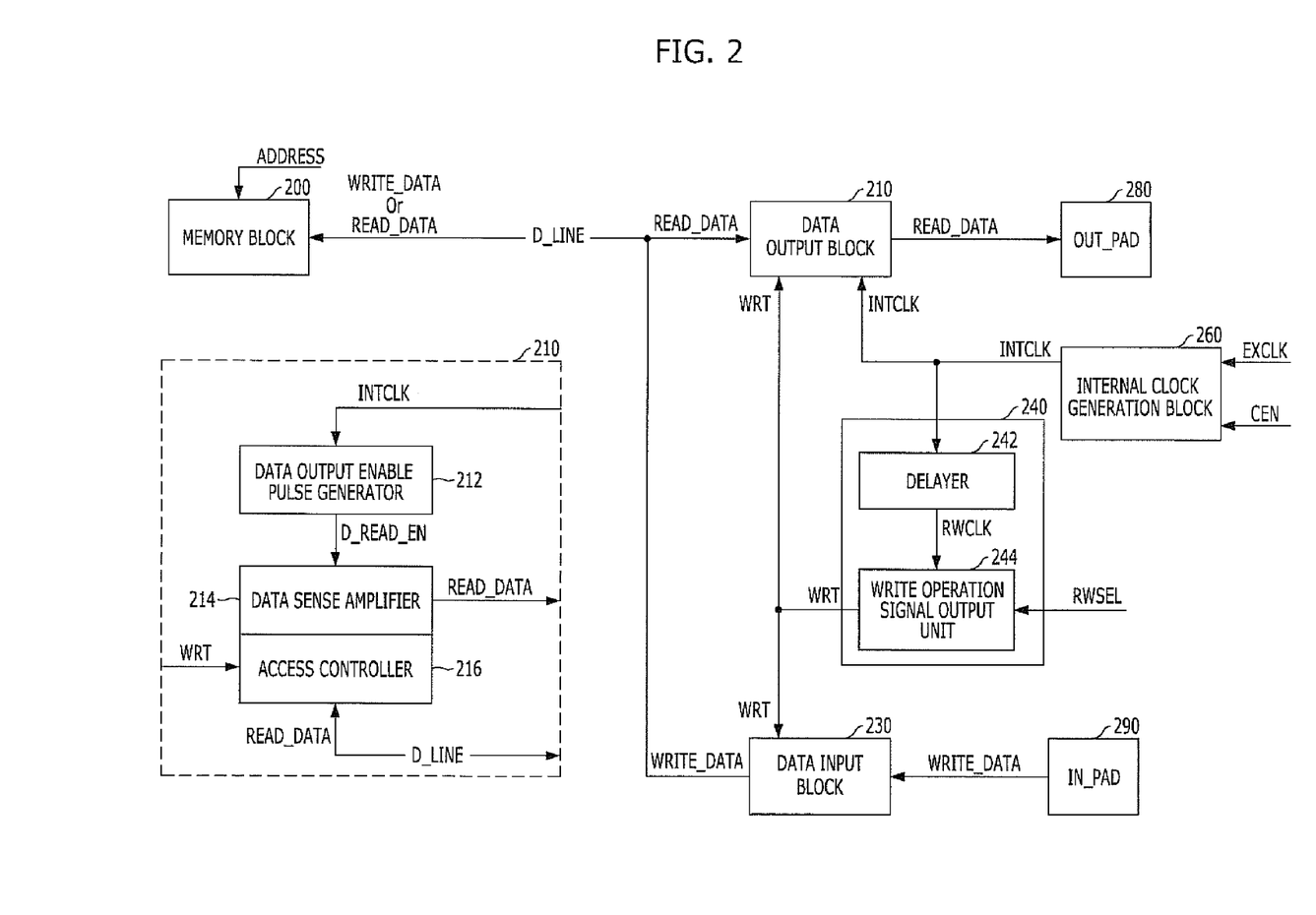
FIG. 2 is a block diagram illustrating an SRAM device in accordance with an embodiment of the present invention.

FIG. 2 is a block diagram illustrating a Static Random Access Memory (SRAM) device in accordance with an embodiment of the present invention.

Referring to FIG. 2, the SRAM device includes a memory block 200, a data output block 210, a write operation signal generation block 240, and a data input block 230. The memory block 200 inputs/outputs a data READ_DATA or WRITE_DATA through a data transfer line D_LINE. The data output block 210 outputs the data READ_DATA loaded on the data transfer line D_LINE to the outside in response to a source clock INTCLK. Here, the access to the data transfer line D_LINE is controlled in response to a write operation signal WRT. The write operation signal generation block 240 generates the write operation signal WRT based on a reference clock RWCLK having a phase delayed from the source clock INTCLK by a predetermined time and an operation selection signal RWSEL. The data input block 230 loads an external data WRITE_DATA on the data transfer line D_LINE in response to the write operation signal WRT.

Here, the memory block 200 includes a plurality of data storage spaces (i.e., units, not shown) for storing a data WRITE_DATA or READ_DATA, and the memory block 200 synchronizes the data of a data storage space selected based on an address signal ADDRESS inputted in response to the source clock INTCLK with the data of the data transfer line D_LINE. In short, when an address signal ADDRESS is applied to the memory block 200 and any one data storage space among the multiple data storage spaces in the inside of the memory block 200 is selected, the data of the selected data storage space and the data loaded on the data transfer line D_LINE are synchronized.

The data output block 210 includes a data output enable pulse generator 212, a data sense amplifier 214, and an access controller 216. The data output enable pulse generator 212 generates a data output enable pulse D_READ_EN that is activated for a predetermined time whenever the source clock INTCLK toggles. The data sense amplifier 214 performs a sense amplification operation onto the data READ_DATA loaded on the data transfer line D_LINE during a period where the data output enable pulse D_READ_EN is activated, latches the resultant data, and outputs a latched data READ_DATA to the outside. The access controller 216 controls the connection between the data sense amplifier 214 and the data transfer line D_LINE.

The write operation signal generation block 240 includes a delayer 242 and a write operation signal output unit 244. The delayer 242 delays the source clock INTCLK by predetermined time and outputs a reference clock RWCLK. The write operation signal output unit 244 synchronizes the operation selection signal RWSEL with the reference clock RWCLK and outputs a write operation signal WRT.

Here, while FIG. 2 shows that the data input block 230 operates in response to the write operation signal WRT, the data input block 230 may operate in response to both the write operation signal WRT and the operation selection signal RWSEL.

The SRAM device in accordance with an embodiment of the present invention described above operates as follows.

First, the operation of synchronizing the data of a selected data storage space of the memory block 200 with the data loaded on the data transfer line D_LINE may be different for a data read operation period and a data write operation period.

More specifically, in the data read operation period, the synchronization operation is performed as follows. The value of the data loaded on the data transfer line D_LINE may be changed, for example, only by the data READ_DATA stored in the selected data storage space of the memory block 200. Thus, the data READ_DATA of the selected data storage space in the memory block 200 are transferred through the data transfer line D_LINE as they are, and after all, the data loaded on the data transfer line D_LINE become the same as the data READ_DATA of the selected data storage space in the memory block 200.

On the other hand, in the data write operation period, the synchronization operation is performed as follows. The value of the data loaded on the data transfer line D_LINE may be changed by the data READ_DATA stored in the selected data storage space of the memory block 200 and the data WRITE_DATA applied by the data input block 230. When the two data READ_DATA and WRITE_DATA are loaded on the data transfer line D_LINE, the data input block 230 has a driving force stronger than the memory block 200 and the value of the data of the selected data storage space and the value of the data loaded on the data transfer line D_LINE are changed by the data WRITE_DATA. After all, the value of the data of the selected data storage space in the memory block 200 and the value of the data loaded on the data transfer line D_LINE become the same as the value of the data WRITE_DATA applied by the data input block 230.

Among the constituent elements of the data output block 210, the data output enable pulse generator 212 generates a data output enable pulse D_READ_EN for setting up a sense amplification operation period of the data sense amplifier 214 in response to the source clock INTCLK. Here, the time corresponding to the length of the period where the data output enable pulse D_READ_EN is activated is to be shorter than a predetermined time between the source clock INTCLK and the reference clock RWCLK.

Also, among the constituent elements of the data output block 210, the access controller 216 couples the data sense amplifier 214 with the data transfer line D_LINE for a period where a write operation signal WRT is inactivated and disconnects the coupling between the data sense amplifier 214 and the data transfer line D_LINE for a period where a write operation signal WRT is activated.

Therefore, among the constituent elements of the data output block 210, the data sense amplifier 214 performs a sense amplification operation onto the data READ_DATA loaded on the data transfer line D_LINE for a period where the data output enable pulse D_READ_EN is activated and the write operation signal WRT is inactivated, i.e., for an overlapping period of the activation of the data output enable pulse D_READ_EN and the inactivation of the write operation signal WRT. Since the data sense amplifier 214 performs the sense amplification operation for a short period, the sense-amplified data READ_DATA is latched and outputted to the outside in a latched state.

Among the constituent elements of the data output block 210, the data sense amplifier 214 is coupled with the data transfer line D_LINE for the period where the write operation signal WRT is inactivated, latches the data READ_DATA loaded on the data transfer line D_LINE whenever the source clock INTCLK toggles, and outputs the latched data. The data sense amplifier 214 is disconnected from the data transfer line D_LINE for the period where the write operation signal WRT is activated and outputs the previously latched data as is.

The data input block 230 loads an external data WRITE_DATA inputted from the outside on the data transfer line D_LINE for the period where the write operation signal WRT is activated and does not load the external data WRITE_DATA inputted from the outside on the data transfer line D_LINE for the period where the write operation signal WRT is inactivated. In other words, the data input block 230 does not operate when the access controller 216 couples the data sense amplifier 214 with the data transfer line D_LINE. When the data sense amplifier 214 is not coupled with the data transfer line D_LINE, the data input block 230 operates.

Here, in case that an operation selection signal RWSEL is directly applied to the data input block 230, the data input block 230 is inactivated for a period where the operation selection signal RWSEL is inactivated. The data input block 230 is activated for a period where the operation selection signal RWSEL is activated.

Meanwhile, the data sense amplifier 214 and the data transfer line D_LINE are not coupled with each other for the period where the write operation signal WRT is activated because a data write operation is performed for the period where the write operation signal WRT is activated. Here, the data write operation is an operation of loading the external data WRITE_DATA, which is applied from the outside through the data input block 230, on the data transfer line D_LINE. In short, the write operation signal generation block 240 is controlled to generate the write operation signal WRT of an enabled state for a period where the data write operation is performed, which is the period where the operation selection signal RWSEL is activated. Therefore, the write operation signal WRT may be regarded to be activated for a period where the data write operation is performed.

Also, the write operation signal WRT is not only generated in response to the source clock INTCLK but also generated in response to the reference clock RWCLK. Therefore, both the data read operation and the data write operation may be performed within one cycle tCK of the source clock INTCLK.

More specifically, even when the data write operation is performed, the operation of the data output block 210 is performed and then the operation of the data input block 230 is performed. That is, the data READ_DATA loaded on the data transfer line D_LINE is sense-amplified for a predetermined time from a moment when the source clock INTCLK is activated to a moment when the reference clock RWCLK is activated, latched, and outputted. And then, an external data WRITE_DATA is stored in the memory block 200 through the data transfer line D_LINE for a period where the reference clock RWCLK is maintained in an enabled state.

Conversely, when the data read operation is performed, the write operation signal generation block 240 is inactivated and does not operate. Thus, no reference clock RWCLK is generated. Therefore, the data output block 210 operates, performs a sense amplification operation onto the data READ- _DATA loaded on the data transfer line D_LINE, and latches and outputs the resultant data, while the data input block 230 does not perform any operation.

Figure 4:
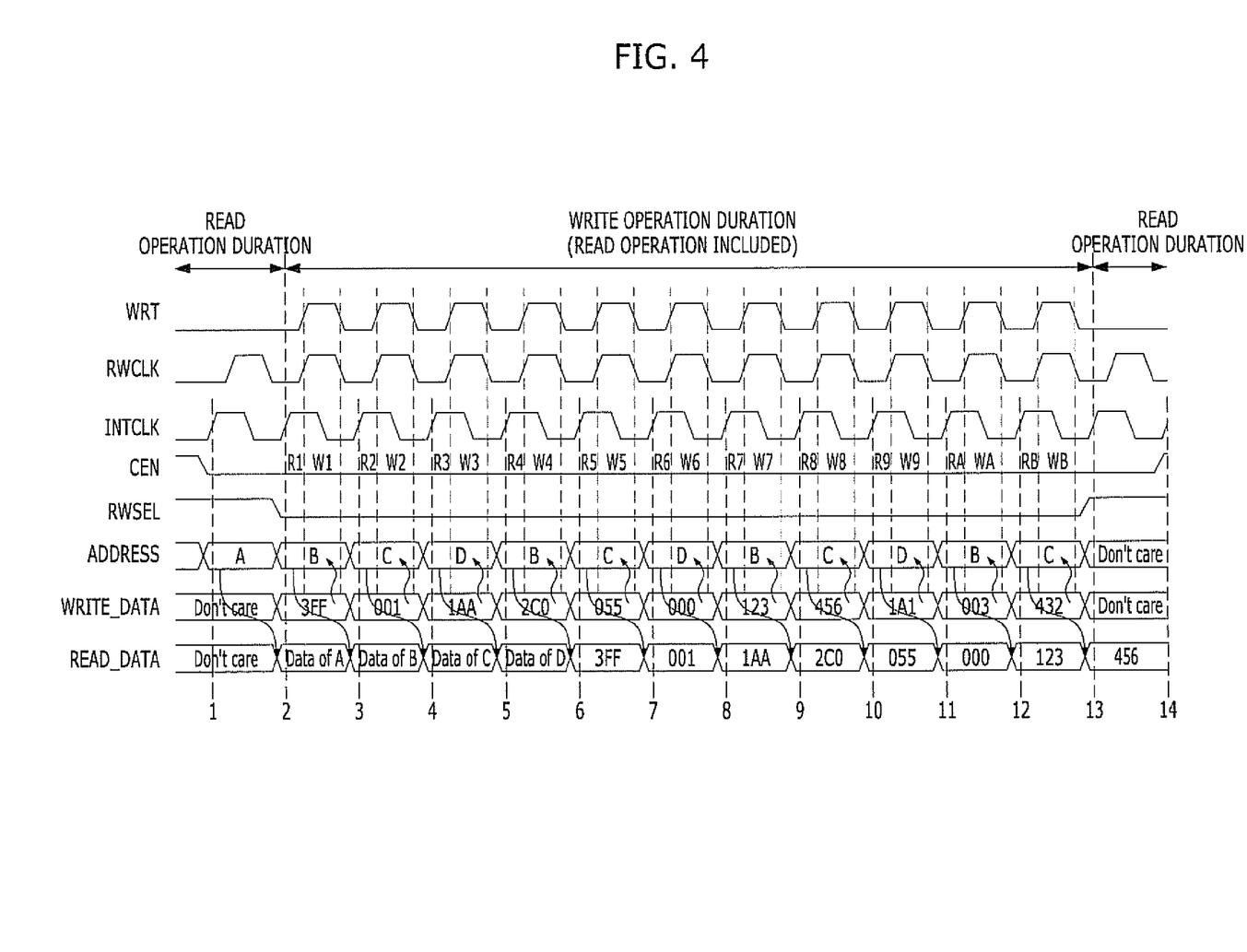
FIG. 4 is a timing diagram illustrating an operation of the SRAM device shown in FIG. 2.

FIG. 4 is a timing diagram illustrating an operation of the SRAM device shown in FIG. 2.

Referring to FIG. 4, in an operation period where a data is read (which is a period corresponding to the $1^{st}$ and $13^{th}$ pulses of a source clock INTCLK) in the SRAM device in accordance with the embodiment of the present invention, an operation of outputting the data READ_DATA (Data of A and 456), that is stored in a data storage space corresponding to an address signal ADDRESS (A and C), is performed. Of course, since a data write operation is not performed for a data read period where a data is read, a write operation signal WRT is in a inactivated state and the value of an external data applied from the outside may be represented by 'Don't care'.

In an operation period where a data is written (which is a period corresponding to the $2^{nd}$ to $12^{th}$ pulses of the source clock INTCLK) in the SRAM device in accordance with the embodiment of the present invention, an operation of outputting the data READ_DATA (Data of B, Data of C, and Data of D→3FF, 001, and 1AA→2C0, 055, and 000→123), that are stored in the data storage space corresponding to an address signal ADDRESS (B, C, and D) is performed. Subsequently, an operation of storing external data WRITE_DATA (3FF, 001, 1AA→2C0, 055, 000→123, 456, 1A1→003, 432, respectively) is performed.

In particular, to have a look at the second to fourth pulse periods of the source clock INTCLK, an operation of outputting the data READ_DATA (Data of B, Data of C, and Data of D), stored in the data storage spaces corresponding to an address signal ADDRESS (B, C, and D), is performed for periods R1, R2, and R3 corresponding to a predetermined time between the activation timings of the source clock INTCLK and a reference clock RWCLK, and an operation of storing external data WRITE_DATA (3FF, 001, and 1AA) in the data storage spaces corresponding to an address signal ADDRESS (B, C, and D) is performed for periods W1, W2, and W3 where the reference clock RWCLK is activated.

To have a look at the fifth to seventh pulse periods of the source clock INTCLK, an operation of outputting the data READ_DATA (3FF, 001, and 1AA), stored in the data storage spaces corresponding to an address signal ADDRESS (B, C and D), is performed for periods R4, R5, and R6 corresponding to the predetermined time between the activation timings of the source clock INTCLK and the reference clock RWCLK, and an operation of storing external data WRITE_DATA (2C0, 055, and 000) in the data storage spaces corresponding to an address signal ADDRESS (B, C, and D) is performed for the periods W4, W5, and W6 where the reference clock RWCLK is activated. Here, the data READ_DATA outputted for the period corresponding to the fifth to seven pulses of the source clock INTCLK are the data stored for the period corresponding to the second to fourth pulses of the source clock INTCLK (i.e., 3FF, 001, and 1AA).

Despite the fact that both outputted data READ_DATA and inputted data WRITE_DATA exist, a data read operation and a data write operation are properly performed without collision within one cycle of the source clock INTCLK. This is because the data read operation and the data write operation may be separately performed within one cycle of the source clock INTCLK due to the source clock INTCLK and the reference clock RWCLK.

In short, the data READ_DATA stored in the data storage space corresponding to the address signal ADDRESS are outputted for a period corresponding to the predetermined time whenever the source clock INTCLK toggles, and the operation of storing the external data in the data storage spaces corresponding to the address signal ADDRESS is performed for a period corresponding to a half cycle 1tCK/2 of the source clock INTCLK after the predetermined time passes from the activation of the source clock INTCLK. Here, since the predetermined time is shorter than the time corresponding to the half cycle 1tCK/2 of the source clock INTCLK, the data read operation and the data write operation may be sequentially performed within one cycle 1tCK of the source clock INTCLK.

Here, the technology of the present invention is described as the reference clock RWCLK is generated by delaying the source clock INTCLK by a predetermined time. However, the source clock INTCLK and the reference clock RWCLK may be generated in the various manners.

Figure 3A:
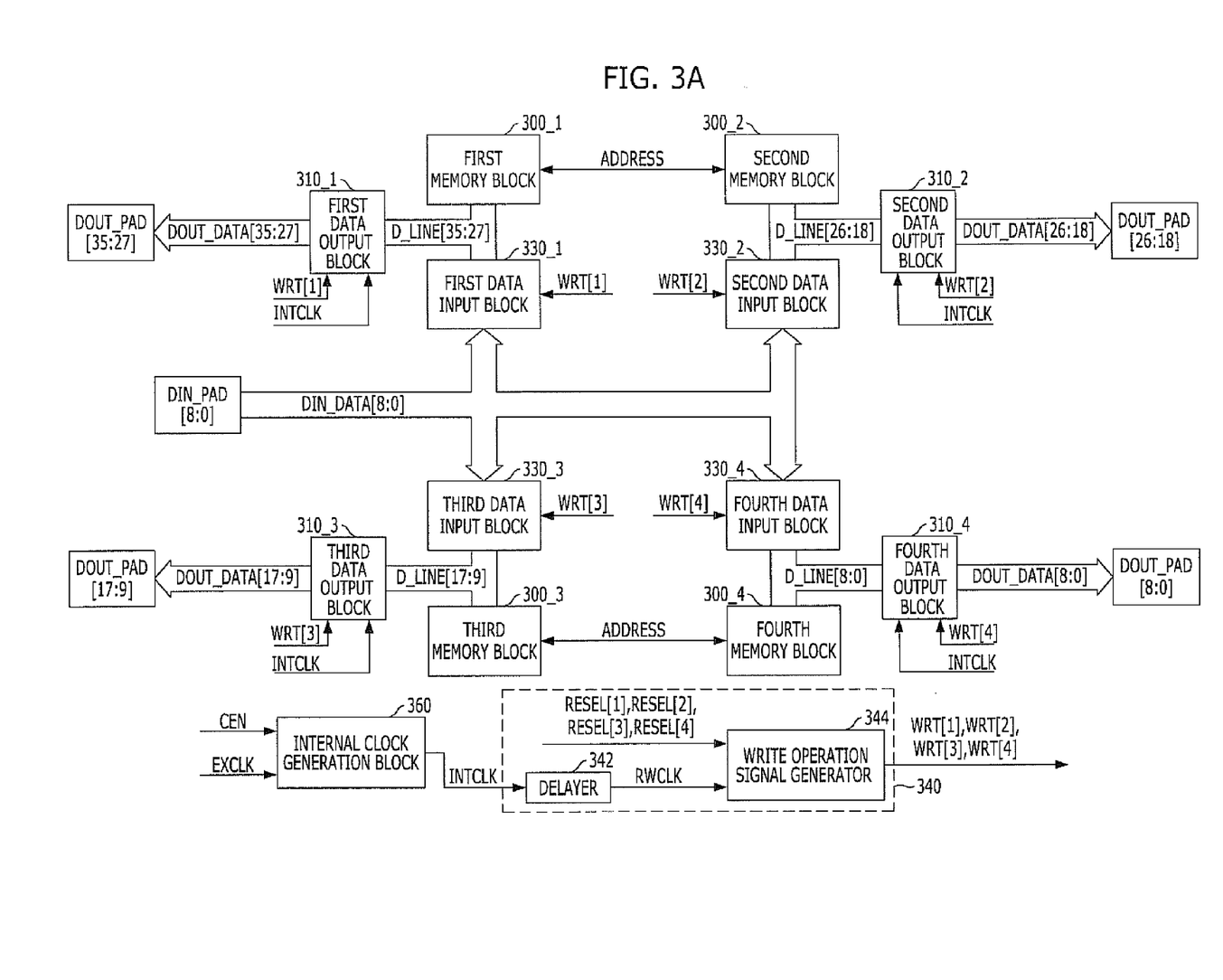
FIGS. 3A and 3B are block diagrams illustrating the SRAM device shown in FIG. 2.
Figure 3B:
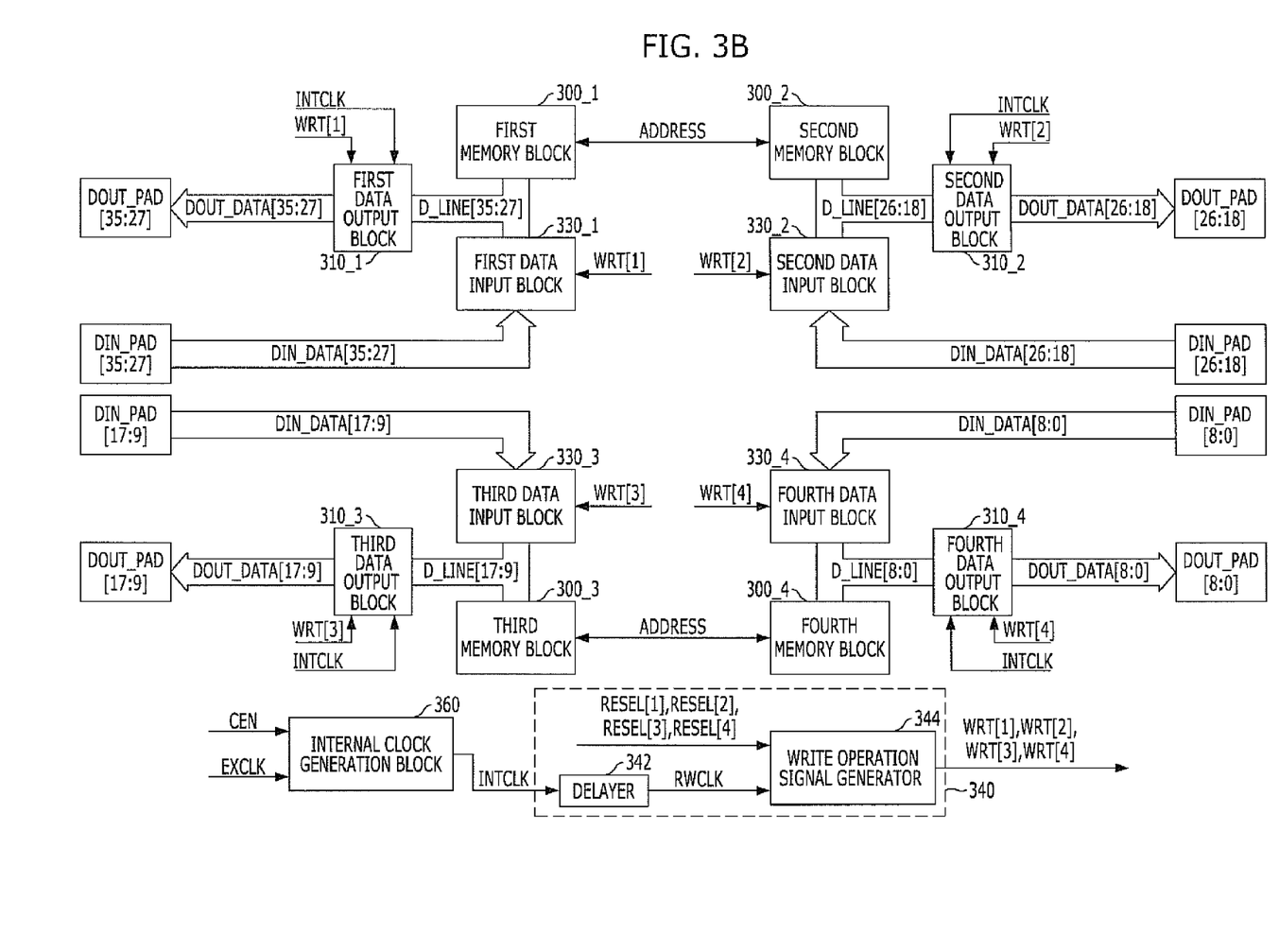

FIGS. 3A and 3B are block diagrams illustrating the SRAM device shown in FIG. 2.

Referring to FIG. 3A, the SRAM device in accordance with the embodiment of the present invention includes a plurality of memory blocks 300_1, 300_2, 300_3, and 300_4, a plurality of data output blocks 310_1, 310_2, 310_3, and 310_4, a write operation signal generation block 340, and a plurality of data input blocks 330_1, 330_2, 330_3, and 330_4.

The memory blocks 300_1, 300_2, 300_3, and 300_4 respectively input data DIN_DATA [8:0] and output data DOUT_DATA [35:27], DOUT_DATA [26:18], DOUT_DATA [17:9], and DOUT_DATA [8:0] through a plurality of data transfer lines D_LINE [35:27], D_LINE [26:18], D_LINE [17:9], and D_LINE [8:0]. The data output blocks 310_1, 310_2, 310_3, and 310_4 respectively output the data DOUT_DATA [35:27], DOUT_DATA [26:18], DOUT_DATA [17:9], and DOUT_DATA [8:0] respectively loaded on the data transfer lines D_LINE [35:27], D_LINE [26:18], D_LINE [17:9], and D_LINE [8:0] in response to the source clock INTCLK. Here, the coupling with the data transfer lines D_LINE [35:27], D_LINE [26:18], D_LINE [17:9], and D_LINE [8:0] are respectively controlled in response to a plurality of write operation signals WRT [1], WRT [2], WRT [3], and WRT [4]. The write operation signal generation block 340 generates the write operation signals WRT [1], WRT [2], WRT [3], and WRT [4] in response to a plurality of operation selection signals RWSEL [1], RWSEL [2], RWSEL [3], and RWSEL [4] that respectively correspond to the memory blocks 300_1, 300_2, 300_3, and 300_4 and a reference clock RWCLK having a delayed phase than the source clock INTCLK by a predetermined time. The data input blocks 330_1, 330_2, 330_3, and 330_4 load an external data DIN_DATA [8:0] that is inputted from the outside on the data transfer lines D_LINE [35:27], D_LINE [26:18], D_LINE [17:9], and D_LINE [8:0], respectively, in response to the write operation signals WRT [1], WRT [2], WRT [3], and WRT [4].

Here, each of the memory blocks 300_1, 300_2, 300_3, and 300_4 includes a plurality of data storage spaces (not shown) for storing data, and synchronizes the data of a data storage space selected based on an address signal ADDRESS that is inputted in response to the source clock INTCLK with the data of the data transfer lines D_LINE [35:27], D_LINE [26:18], D_LINE [17:9], and D_LINE [8:0]. In other words, as illustrated in the drawing, the memory blocks 300_1, 300_2, 300_3, and 300_4 are respectively coupled with the data transfer lines D_LINE [35:27], D_LINE [26:18], D_LINE [17:9], and D_LINE [8:0]. The data of data storage spaces of the memory blocks 300_1, 300_2, 300_3 and 300_4 that are respectively selected based on the address signal ADDRESS applied to the memory blocks 300_1, 300_2, 300_3, and 300_4 are synchronized with the data loaded on the data transfer lines D_LINE [35:27], D_LINE [26:18], D_LINE [17:9], and D_LINE [8:0], respectively.

The data output blocks 310_1, 310_2, 310_3, and 310_4 have the same structure as the structure of the data output block 210 illustrated in FIG. 2. In other words, each of the data output blocks 310_1, 310_2, 310_3, and 310_4 includes the data output enable pulse generator 212, the data sense amplifier 214, and the access controller 216, and the operations of the data output enable pulse generator 212, the data sense amplifier 214, and the access controller 216 are the same as those shown in FIG. 2. Therefore, each of the data output blocks 310_1, 310_2, 310_3, and 310_4 is disconnected from a corresponding data transfer line among the data transfer lines D_LINE [35:27], D_LINE [26:18], D_LINE [17:9], and D_LINE [8:0] when a corresponding write operation signal among the write operation signals WRT [1], WRT [2], WRT [3], and WRT [4] is activated and applied. When a corresponding write operation signal among the write operation signals WRT [1], WRT [2], WRT [3], and WRT [4] is inactivated and applied, each of the data output blocks 310_1, 310_2, 310_3, and 310_4 is coupled with a corresponding data transfer line among the data transfer lines D_LINE [35:27], D_LINE [26:18], D_LINE [17:9], and D_LINE [8:0].

To sum up, each of the data output blocks 310_1, 310_2, 310_3, and 310_4 is coupled with a corresponding data transfer line among the data transfer lines D_LINE [35:27], D_LINE [26:18], D_LINE [17:9], and D_LINE [8:0] for a period where a corresponding write operation signal among the write operation signals WRT [1], WRT [2], WRT [3], and WRT [4] is inactivated and latches and outputs the data loaded on the corresponding data transfer line among the data transfer lines D_LINE [35:27], D_LINE [26:18], D_LINE [17:9], and D_LINE [8:0] whenever the source clock INTCLK is toggled. Also, each of the data output blocks 310_1, 310_2, 310_3 and 310_4 is disconnected from a corresponding data transfer line among the data transfer lines D_LINE [35:27], D_LINE [26:18], D_LINE [17:9], and D_LINE [8:0] for a period where an applied write operation signal among the write operation signals WRT [1], WRT [2], WRT [3], and WRT [4] is activated and outputs the previously latched data as they are.

The SRAM device includes a plurality of data output pads DOUT_PAD [35:27], DOUT_PAD [26:18], DOUT_PAD [17:9], and DOUT_PAD [8:0] and a common data input pad DIN_PAD [8:0]. The data output pads DOUT_PAD [35:27], DOUT_PAD [26:18], DOUT_PAD [17:9], and DOUT_PAD [8:0] are respectively coupled with the data output blocks 310_1, 310_2, 310_3, and 310_4 and output data DOUT_DATA [35:27], DOUT_DATA [26:18], DOUT_DATA [17:9], and DOUT_DATA [8:0] that are respectively transferred from the data output blocks 310_1, 310_2, 310_3, and 310_4 to the outside. The common data input pad DIN_PAD [8:0] are coupled in common with the data input blocks 330_1, 330_2, 330_3, and 330_4, receives the external data DIN_DATA [8:0] that is inputted from the outside, and transfers the received external data DIN_DATA [8:0] to the data input blocks 330_1, 330_2, 330_3, and 330_4 in common.

The write operation signal generation block 340 includes a delayer 342 and a write operation signal generator 344. The delayer 342 delays the source clock INTCLK by a predetermined time and outputs the delayed source clock as a reference clock RWCLK. The write operation signal generator 344 synchronizes the operation selection signals RWSEL [1], RWSEL [2], RWSEL [3], and RWSEL [4] with the reference clock RWCLK and outputs the write operation signals WRT [1], WRT [2], WRT [3], and WRT [4].

Here, FIG. 3A shows the data input blocks 330_1, 330_2, 330_3, and 330_4 operate in response to the write operation signals WRT [1], WRT [2], WRT [3], and WRT [4]. However, the data input blocks 330_1, 330_2, 330_3, and 330_4 may operate in response to the write operation signals WRT [1], WRT [2], WRT [3], and WRT [4] and the operation selection signals RWSEL [1], RWSEL [2], RWSEL [3], and RWSEL [4].

As described in the above-described structure, the SRAM device shown in FIG. 3A has an extended structure of that of the SRAM device shown in FIG. 2.

In particular, the data DIN_DATA [8:0] that are inputted through the common data input pad DIN_PAD [8:0] which is coupled in common with the data input blocks 330_1, 330_2, 330_3, and 330_4 are stored in any one memory block among the memory blocks 300_1, 300_2, 300_3, and 300_4.

Also, the data output blocks 310_1, 310_2, 310_3, and 310_4 respectively outputs the data DOUT_DATA [35:27], DOUT_DATA [26:18], DOUT_DATA [17:9], and DOUT_DATA [8:0] that are stored in the memory blocks 300_1, 300_2, 300_3, and 300_4 through the data output pads DOUT_PAD [35:27], DOUT_PAD [26:18], DOUT_PAD [17:9], and DOUT_PAD [8:0] which are coupled independently.

Therefore, in the structure of FIG. 3A, one command of the operation selection signals RWSEL [1], RWSEL [2], RWSEL [3], and RWSEL [4] may be activated, and when any one command is in an activated state, the other commands are kept in an inactivated state. In short, one of the memory blocks 300_1, 300_2, 300_3, and 300_4 may perform a data write operation at the same time, and when any one memory block is performing a data write operation, the other memory blocks perform a data read operation.

Of course, as mentioned in the description of the structure shown in FIG. 2, the memory block of the structure shown in FIG. 3A may have an operation period including both the data read operation period and the data write operation period within one cycle of the source clock INTCLK.

For example, when the first memory block 300_1 performed a data write operation and the other memory blocks 300_2, 300_3, and 300_4 perform a data read operation, they operate as follows.

First, the second to fourth data input blocks 330_2, 330_3, and 330_4 corresponding to the second to fourth memory blocks 300_2, 300_3, and 300_4 that perform the data read operation in the cycle of the source clock INTCLK do not perform a data input operation and they do not receive the external data DIN_DATA [8:0] through the common data input pad DIN_PAD [8:0], and the second to fourth data output blocks 310_2, 310_3, and 310_4 corresponding to the second to fourth memory blocks 300_2, 300_3, and 300_4 that perform the data read operation are all activated and respectively output the data DOUT_DATA [26:18], DOUT_DATA [17:9], and DOUT_DATA [8:0] that are stored in the second to fourth memory blocks 300_2, 300_3, and 300_4 that perform the data read operation.

On the other hand, the first data output block 310_1 and the first data input block 330_1 corresponding to the first memory block 300_1 that performs the data write operation in the cycle of the source clock INTCLK are activated. Here, the first data output block 310_1 is activated for a predetermined time from a moment when the source clock INTCLK is activated to a moment when the reference clock RWCLK is activated, and the activated first data output block 310_1 sense-amplifies the data DOUT_DATA [35:27] loaded on the data transfer line D_LINE [35:27], latches it, and outputs it through the data output pad DOUT_PAD [35:27]. The first data input block 330_1 is activated for a period where the reference clock RWCLK is maintained in an activated state and stores the external data DIN_DATA [8:0] that is inputted through the common data input pad DIN_PAD [8:0] in the first memory block 300_1 that performs the data write operation.

Referring to FIG. 3B, the data input blocks 330_1, 330_2, 330_3, and 330_4 store a plurality of data DIN_DATA [35:27], DIN_DATA [26:18], DIN_DATA [17:9], and DIN_DATA [8:0] that are respectively received through a plurality of data input pads DIN_PAD [35:27], DIN_PAD [26:18], DIN_PAD [17:9], and DIN_PAD [8:0] which are independently coupled with the data input blocks 330_1, 330_2, 330_3, and 330_4 in the memory blocks 300_1, 300_2, 300_3, and 300_4, respectively.

Also, the data output blocks 310_1, 310_2, 310_3, and 310_4 output the data DOUT_DATA [35:27], DOUT_DATA [26:18], DOUT_DATA [17:9], and DOUT_DATA [8:0] that are respectively stored in the memory blocks 300_1, 300_2, 300_3, and 300_4 through the data output pads DOUT_PAD [35:27], DOUT_PAD [26:18], DOUT_PAD [17:9], and DOUT_PAD [8:0] that are independently coupled with the data output blocks 310_1, 310_2, 310_3, and 310_4, respectively.

In short, it is different from the structure of FIG. 3A that the structure of FIG. 3B includes the data input pads DIN_PAD [8:0], DIN_PAD [17:9], DIN_PAD [26:18], and DIN_PAD [35:27] that respectively correspond to the memory blocks 300_1, 300_2, 300_3, and 300_4.

Therefore, the operation selection signals RWSEL [1], RWSEL [2], RWSEL [3], and RWSEL [4] may be all activated or inactivated simultaneously in the structure of FIG. 3B. In short, the memory blocks 300_1, 300_2, 300_3, and 300_4 do not affect each other when entering an operation mode and thus they may all perform a data write operation independently or perform a data read operation independently.

Of course, as mentioned in the description of the structure of FIG. 2, a data memory block of the structure shown FIG. 3B may have an operation period including both the data read operation period and the data write operation period within one cycle of the source clock INTCLK.

For example, when the first and second memory blocks 300_1 and 300_2 perform a data write operation and the third and fourth memory blocks 300_3 and 300_4 perform a data read operation, the first to fourth memory blocks 300_1, 300_2, 300_3, and 300_4 operate as follows.

First, the third and fourth data input blocks 330_3 and 330_4 corresponding to the third and fourth memory blocks 300_3 and 300_4 that perform the data read operation in the cycle of the source clock INTCLK do not perform a data input operation and they do not receive the external data DIN_DATA [17:9] and DIN_DATA [8:0] through the data input pads DIN_PAD [17:9] and DIN_PAD [8:0], and the third and fourth data output blocks 310_3 and 310_4 corresponding to the third and fourth memory blocks 300_3 and 300_4 that perform the data read operation are all activated and respectively output the data DOUT_DATA [17:9] and DOUT_DATA [8:0] that are stored in the third and fourth memory blocks 300_3 and 300_4 that perform the data read operation.

On the other hand, the first and second data output blocks 310_1 and 310_2 and the first and second data input blocks 330_1 and 330_2 corresponding to the first and second memory blocks 300_1 and 300_2 that perform the data write operation in the cycle of the source clock INTCLK are activated. Here, the first and second data output block 310_1 and 310_2 are activated for a predetermined time from a moment when the source clock INTCLK is activated to a moment when the reference clock RWCLK is activated, and the activated first and second data output blocks 310_1 and 310_2 sense-amplify the data DOUT_DATA [35:27] and DOUT_DATA [26:18] loaded on the data transfer lines D_LINE [35:27] and D_LINE [26:18], latch it, and output it through the data output pads DOUT_PAD [35:27] and DOUT_PAD [26:18]. The first and second data input blocks 330_1 and 330_2 are activated for a period where the reference clock RWCLK is maintained in an activated state and store the external data DIN_DATA [35:27] and DIN_DATA [26:18] that are inputted through the data input pads DIN_PAD [35:27] and DIN_PAD [26:18] in the first and second memory blocks 300_1 and 300_2 that perform the data write operation.

Figure 5:
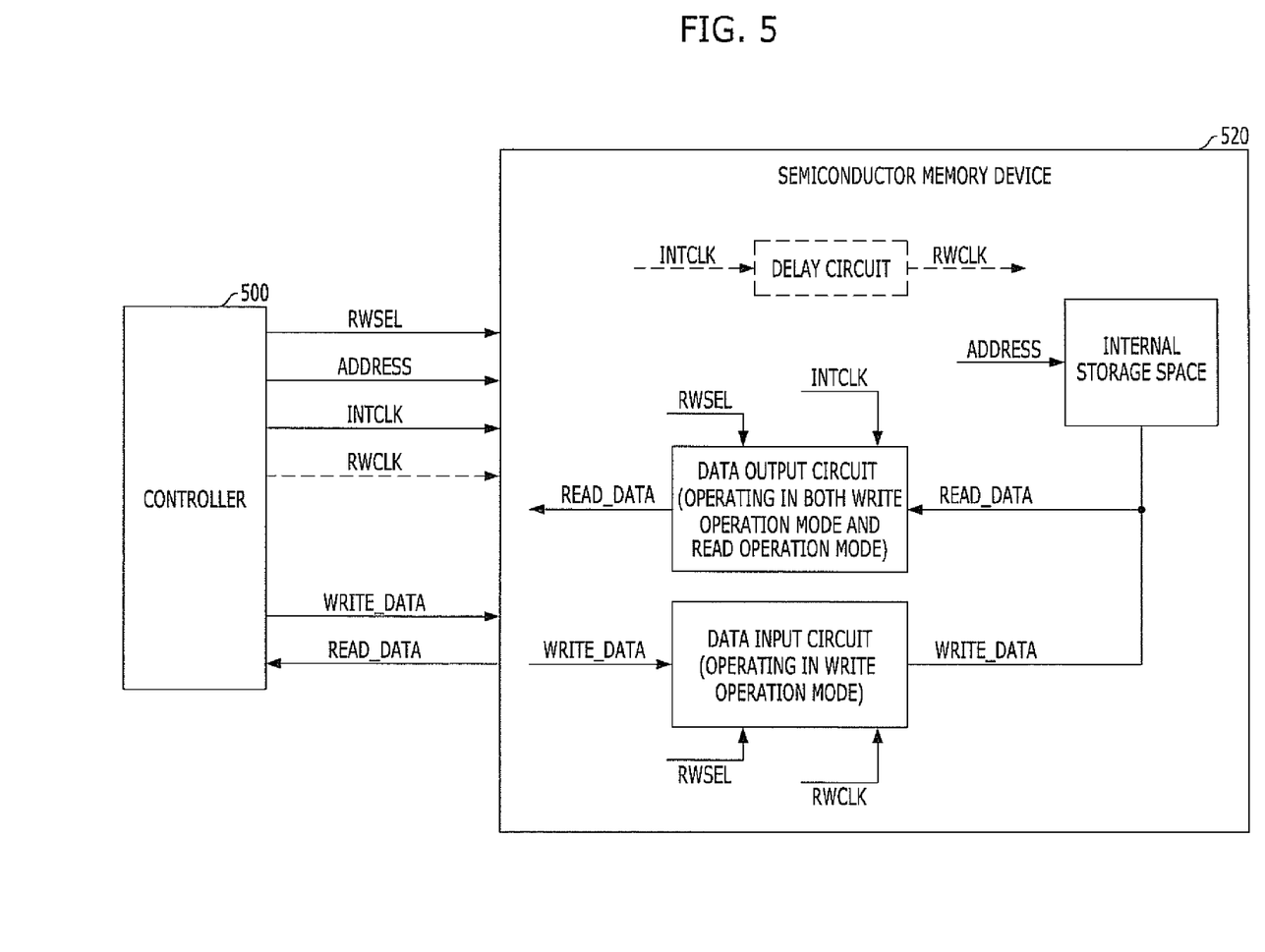
FIG. 5 is a block diagram illustrating a semiconductor system for inputting/outputting a series of data including the SRAM device of FIG. 2.

FIG. 5 is a block diagram illustrating a semiconductor system for inputting/outputting a series of data to which the SRAM device of FIG. 2 is applied.

Referring to FIG. 5, the semiconductor system includes a controller 500 and a semiconductor memory device 520. The controller 500 controls whether to activate or inactivate an operation selection signal RWSEL. The semiconductor memory device 520 is controlled to enter a write operation mode where data READ_DATA and WRITE_DATA are read and written within one cycle of the source clock INTCLK or a read operation mode where data READ_DATA are read depending on whether the operation selection signal RWSEL is activated or inactivated. The semiconductor memory device 520 enters a write operation mode when the operation selection signal RWSEL is activated, latches and outputs a data READ_DATA stored therein for an initially predetermined time whenever the source clock INTCLK toggles, and then stores a data WRITE_DATA transferred from the controller 500 therein. The semiconductor memory device 520 enters a read operation mode when the operation selection signal RWSEL is inactivated and outputs the data READ_DATA stored therein whenever the source clock INTCLK toggles.

Here, the controller 500 generates not only the operation selection signal RWSEL but also the address signal ADDRESS to select an internal storage space of the semiconductor memory device 520 which the data READ_DATA and WRITE_DATA are inputted/outputted to/from.

Therefore, the semiconductor memory device 520 latches the data READ_DATA stored in the internal storage space that is selected based on the address signal ADDRESS for a predetermined time from a toggling moment of the source clock INTCLK in a period where the operation selection signal RWSEL is activated, outputs the latched data for one cycle of the source clock INTCLK, and stores the data WRITE_DATA inputted from the controller 500 in an internal storage space selected based on an address signal ADDRESS in response to the reference clock RWCLK lagging behind the source clock INTCLK by a predetermined time.

In other words, the semiconductor memory device 520 is a constituent element that performs the same operation as the SRAM device described with reference to FIG. 2 and it may include both the data read operation period and the data write operation period within one cycle of the source clock INTCLK when a data write operation where the operation selection signal RWSEL is activated is performed.

The reference clock RWCLK used for the semiconductor memory device 520 to have the data read operation period and the data write operation period within one cycle of the source clock INTCLK may be defined based on the following two methods.

First, the source clock INTCLK is generated in the controller 500 and transferred to the semiconductor memory device 520, and the reference clock RWCLK is generated by delaying the source clock INTCLK by a predetermined time in the inside of the semiconductor memory device 520.

Second, the controller 500 generates the source clock INTCLK and the reference clock RWCLK and transfers them to the semiconductor memory device 520. Of course, when the source clock INTCLK and the reference clock RWCLK are generated in the controller 500, the source clock INTCLK has a preceding phase than the reference clock RWCLK by a predetermined time.

According to the technology of the present invention described above, the SRAM device operates to perform a plurality of predetermined operations in a predetermined operation period when the SRAM device performs a read operation and a write operation onto image data of a burst pattern.

In particular, when the SRAM device performs a read operation and a write operation onto image data of a burst pattern, the SRAM device performs the write operation after performing the read operation in a write operation period.

Therefore, when the SRAM device is to perform a particular operation in a burst pattern, for example, read and write image data of a burst pattern, the SRAM device may perform the operation stably although the frequency of a source clock is maintained at a sufficiently low level. In addition, the SRAM device according to an embodiment of the present invention may minimize the amount of current consumption.

According to an embodiment of the present invention, a semiconductor memory device operates to perform a plurality of predetermined operations in a predetermined operation period when reading and writing image data of a burst pattern.

Particularly, a semiconductor memory device may operate to perform a read operation and then perform a write operation in a write operation period when reading and writing image data of a burst pattern.

Therefore, when a reading and writing image data of a burst pattern, the semiconductor memory device may perform all operations stably even though the frequency of a source clock is maintained at a sufficiently low level, and the semiconductor memory device may maintain the amount of current consumption at a minimum level.

While the present invention has been described with respect to the specific embodiments, it will be apparent to those skilled in the art that various changes and modifications may be made without departing from the spirit and scope of the invention as defined in the following claims.

For example, while an embodiment where the SRAM device performs both the read operation and the write operation in a write operation period is described above, a plurality of predetermined operations may be performed upon receipt of a predetermined command.

What is claimed is:

1. A semiconductor memory device, comprising:
a memory block configured to store a data transferred through a data transfer line;
a data output block configured to output the data loaded on the data transfer line in response to a source clock, wherein the data output block is controlled to be coupled with the data transfer line in response to a write operation signal;
a write operation signal generation block configured to generate the write operation signal in response to an operation selection signal and a reference clock lagging behind the source clock by a set time; and
a data input block configured to load the data on the data transfer line in response to the write operation signal, wherein the data output block comprises:
a data output enable pulse generator configured to generate a data output enable pulse that is activated for a predetermined time whenever the source clock pulses;
a data sense amplifier configured to sense-amplify the data loaded on the data transfer line for a period that the data output enable pulse is activated, latch a sense-amplified data, and output a latched data; and
an access controller configured to control the data sense amplifier to be coupled with the data transfer line in response to the write operation signal.

2. The semiconductor memory device of claim 1, wherein the memory block comprises a plurality of data storage units each for storing the data, and
the memory block is configured to synchronize the data of the data storage unit selected based on an address signal inputted in response to the source clock with the data of the data transfer line.

3. The semiconductor memory device of claim 2, wherein the data output block is coupled with the data transfer line for a period that the write operation signal is inactivated, latches the data loaded on the data transfer line whenever the source clock pulses to produce a latched data, and outputs the latched data, and
the data output block is disconnected from the data transfer line for a period that the write operation signal is activated and outputs a previously latched data without a change.

4. The semiconductor memory device of claim 2, wherein the write operation signal generation block comprises:
a delayer configured to delay the source clock by the set time and output the reference clock; and
a write operation signal output unit configured to synchronize the operation selection signal with the reference clock and output the write operation signal.

5. The semiconductor memory device of claim 3, wherein the data input block loads the data on the data transfer line for a period that the write operation signal is activated, and
the data input block is inactivated for a period that the write operation signal is inactivated.

6. The semiconductor memory device of claim 5, wherein the data input block is inactivated for a period that the operation selection signal is inactivated, and
the data input block is activated for a period that the operation selection signal is activated.

7. A semiconductor memory device, comprising:
a plurality of memory blocks configured to store data transferred through a plurality of data transfer lines, respectively;
a plurality of data output blocks configured to output the data loaded on the data transfer lines in response to a source clock, wherein the data output blocks are controlled to be coupled with the data transfer lines in response to a plurality of write operation signals;
a write operation signal generation block configured to generate the write operation signals in response to a plurality of operation selection signals that respectively correspond to the memory blocks and a reference clock lagging behind the source clock by a set time; and
a plurality of data input blocks configured to load the data on the data transfer lines in response to the write operation signals, respectively.

8. The semiconductor memory device of claim 7, wherein each of the memory blocks comprises a plurality of data storage units each for the storing data, and
the memory block is configured to synchronize the data of the data storage unit selected based on an address signal inputted in response to the source clock with the data of the corresponding data transfer line.

9. The semiconductor memory device of claim 8, wherein each of the data output blocks is coupled with the corresponding data transfer line for a period that the corresponding write operation signals is inactivated, latches the data loaded on the data transfer line whenever the source clock pulses, and outputs a latched data, and
each of the data output block is disconnected from the corresponding data transfer line for a period that the write operation signals in activated and outputs a previously latched data without a change.

10. The semiconductor memory device of claim 8, further comprising:
a plurality of data output pads coupled with the data output blocks, respectively, and configured to output the data transferred from the data output blocks to outside; and
a common data input pad coupled in common with the data input blocks and configured to receive an external data and transfer the external data in common to the data input blocks.

11. The semiconductor memory device of claim 10, wherein the data input blocks load the external data inputted through the common data input pad on the data transfer line a period that the write operation signals are activated, and
the data input blocks are inactivated for a period that the write operation signals are inactivated.

12. The semiconductor memory device of claim 11, wherein the data input blocks are inactivated for a period that the operation selection signals are inactivated, and
the data input blocks are activated for a period that the operation selection signals are activated.

13. The semiconductor memory device of claim 8, further comprising:
a plurality of data output pads respectively coupled with the data output blocks and configured to output the data respectively transferred from the data output blocks to outside; and
a plurality of data input pads respectively coupled with the data input blocks and configured to receive a plurality of data transferred from outside and transfer the received data to the data input blocks, respectively.

14. The semiconductor memory device of claim 13, wherein the data input blocks load the data inputted through the data input pads on the data transfer lines for a period that the write operation signals are activated, and
the data input blocks are inactivated for a period that the write operation signals are inactivated.

15. The semiconductor memory device of claim 14, wherein the data input blocks are inactivated for a period that the operation selection signals are inactivated, and
the data input blocks are activated for a period that the operation selection signals are activated.

16. A method for operating a semiconductor memory device inputting/outputting a data through a data transfer line, comprising:

latching a data loaded on the data transfer line in response to a source clock and outputting a latched data to outside;
loading an external data on the data transfer line in response to a reference clock lagging behind the source clock by a set time, when an operation selection signal is activated; and
receiving the source clock and the reference clock through different clock input pads.

17. The method of claim 16, wherein, during a cycle of the source clock when the operation selection signal is activated, the data loaded on the data transfer line is latched and outputted for the set time in response to the source clock and, after the set time, the external data is loaded on the data transfer line in response to the reference clock.

18. The method of claim 16, further comprising:
generating the reference clock by delaying the source clock by a predetermined time which is longer than the set time.

19. A semiconductor system, comprising:
a controller configured to control an operation selection signal to be activated or inactivated; and
a semiconductor memory device configured to perform a data read and write operation or a data read operation within one cycle of a source clock based on whether the operation selection signal is activated or inactivated,
wherein the semiconductor memory device, when the operation selection signal is activated, latches a data stored therein and outputs a latched data for a set time whenever the source clock pulses, and receives and stores a data transferred from the controller therein after the output of the latched data, and
the semiconductor memory device, when the operation selection signal is inactivated, outputs the data stored therein to the controller whenever the source clock pulses.

20. The semiconductor system of claim 19, wherein the controller selects an internal storage unit of the semiconductor memory device to/from which a data is to be inputted/outputted by generating an address signal.

21. The semiconductor system of claim 20, wherein, when the operation selection signal is activated,
the semiconductor memory device latches the data stored in the internal storage unit selected based on the address signal for the set time from the moment when the source clock pulses and outputs a latched data during one cycle of the source clock, and
the semiconductor memory device stores the data transferred from the controller in the internal storage unit selected based on the address signal in response to a reference clock lagging behind the source clock by the set time.

22. The semiconductor system of claim 21, wherein the source clock is generated in the controller and transferred to the semiconductor memory device, and
the reference clock is generated by delaying the source clock as much as a predetermined time which is longer than the set time in the semiconductor memory device.

23. The semiconductor system of claim 21, wherein the source clock and the reference clock are generated in the controller and transferred to the semiconductor memory device.

* * * * *